(12) United States Patent
Chi et al.

(10) Patent No.: US 12,328,934 B2
(45) Date of Patent: Jun. 10, 2025

(54) ELECTRONIC DEVICE AND DIODE

(71) Applicant: Innolux Corporation, Miaoli County (TW)

(72) Inventors: Jen-Hai Chi, Miaoli County (TW); Chih-Yung Hsieh, Miaoli County (TW)

(73) Assignee: Innolux Corporation, Miaoli Country (TW)

( * ) Notice: Subject to any disclaimer, the term of this patent is extended or adjusted under 35 U.S.C. 154(b) by 0 days.

(21) Appl. No.: 18/187,682

(22) Filed: Mar. 22, 2023

(65) Prior Publication Data
US 2023/0352474 A1 Nov. 2, 2023

Related U.S. Application Data

(60) Provisional application No. 63/335,226, filed on Apr. 27, 2022.

(30) Foreign Application Priority Data

Jan. 6, 2023 (CN) .......................... 202310018685.1

(51) Int. Cl.
*H10D 84/80* (2025.01)
*H03K 17/687* (2006.01)

(52) U.S. Cl.
CPC ....... *H10D 84/811* (2025.01); *H03K 17/6871* (2013.01)

(58) Field of Classification Search
CPC ... H01L 27/0629; H01L 23/49; H01L 29/861; H03K 17/6871; H03K 17/74; H03K 2217/0081
See application file for complete search history.

(56) References Cited

FOREIGN PATENT DOCUMENTS

CN 104467671 3/2015
JP 2007228231 A * 9/2007

OTHER PUBLICATIONS

National Semiconductor, Precision Micropower Shunt Voltage Reference (Year: 2010).*

* cited by examiner

*Primary Examiner* — Metasebia T Retebo
(74) *Attorney, Agent, or Firm* — JCIPRNET

(57) ABSTRACT

An electronic device and a diode are provided. The electronic device includes a switch circuit and a diode. The switch circuit includes a transistor. The diode has a first pin and a second pin. The first pin is electrically coupled to the transistor. The second pin is an idle contact.

17 Claims, 5 Drawing Sheets

ELECTRONIC DEVICE AND DIODE

CROSS-REFERENCE TO RELATED APPLICATION

This application claims the priority benefit of U.S. provisional application Ser. No. 63/335,226, filed on Apr. 27, 2022, and China application serial no. 202310018685.1, filed on Jan. 6, 2023. The entirety of each of the above-mentioned patent applications is hereby incorporated by reference herein and made a part of this specification.

BACKGROUND

Technical Field

The disclosure relates to an electronic device and a diode; more particularly, the disclosure relates to an electronic device including a diode and a diode.

Description of Related Art

Existing electronic devices include polar elements, and the polar elements are, for instance, diodes, any type of light emitting diodes, varactors, and so on.

However, due to different polarity designs, the polarity of pins of the polar element is required to be reversed, and therefore the outer look of the polar element (e.g., a housing of the element) and the pins should be re-designed based on different circuit designs. For instance, transistors of a switch circuit of a first electronic device are mainly n-type transistors, and transistors of a switch circuit of a second electronic device are mainly p-type transistors. The polar elements adapted to the first electronic device are not applicable to the second electronic device, and the polar elements adapted to the second electronic device are not applicable to the first electronic device.

Therefore, how to provide a polar element compatible with different polarity designs is one of the research focuses of people skilled in the pertinent art.

SUMMARY

The disclosure provides an electronic device including a diode.

According to an embodiment of the disclosure, an electronic device that includes a switch circuit and a diode is provided. The switch circuit includes a transistor. The diode has a first pin and a second pin. The first pin is electrically coupled to the transistor. The second pin is an idle contact.

According to an embodiment of the disclosure, a diode that includes a first pin, a second pin, a third pin, and a fourth pin is provided. The first pin, the second pin, the third pin, and the fourth pin are disposed in a point symmetrical manner.

In order for the features and advantages of the disclosure to be more comprehensible, the following specific embodiments are described in detail in conjunction with the drawings.

BRIEF DESCRIPTION OF THE DRAWINGS

The accompanying drawings, which are included to provide a further understanding of the disclosure, are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
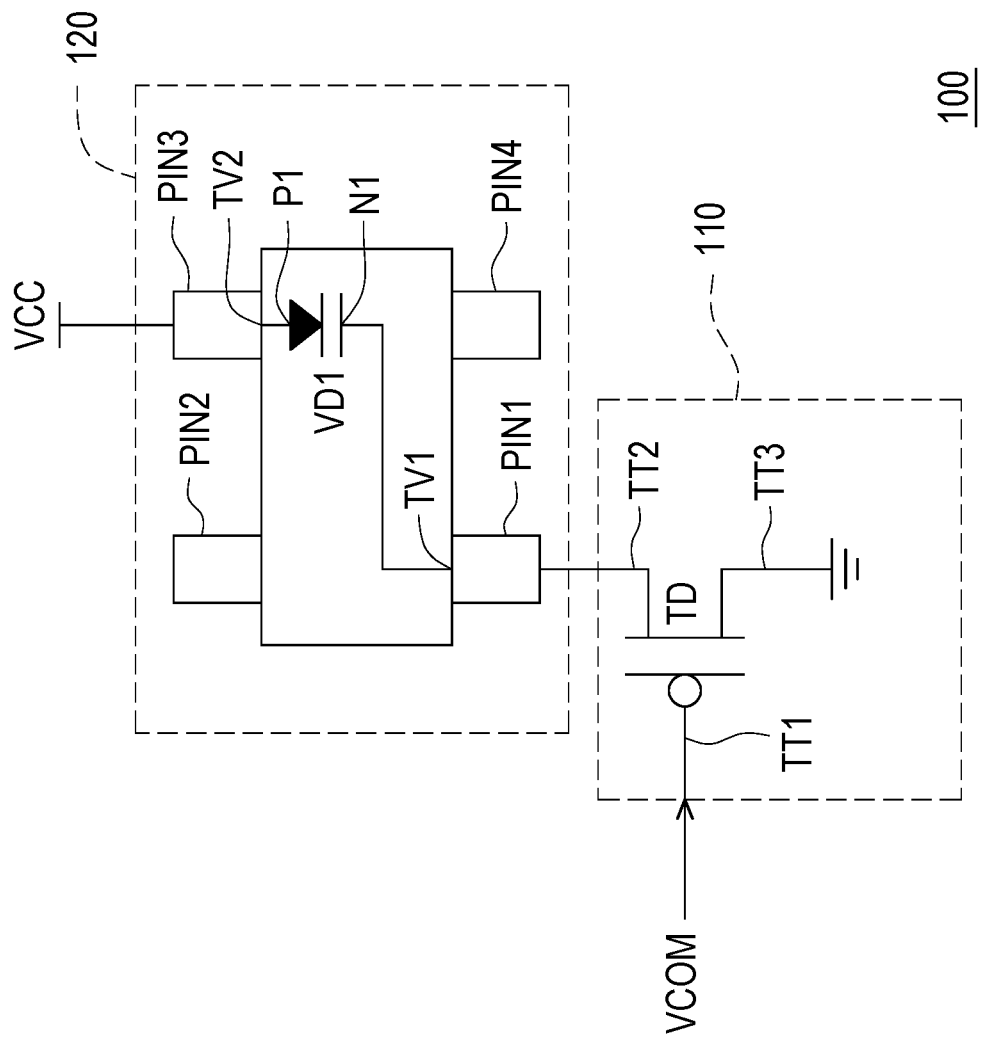
FIG. 1 is a schematic view of an electronic device according to an embodiment of the disclosure.

The disclosure may be understood with reference to the following detailed description with the drawings. Note that for clarity of description and ease of understanding, the drawings of the disclosure show a part of an electronic device, and certain elements in the drawings may not be drawn to scale. In addition, the number and size of each device shown in the drawings simply serve for exemplifying instead of limiting the scope of the disclosure.

Certain terminologies are used throughout the description and the appended claims to refer to specific elements. As to be understood by those skilled in the art, electronic device manufacturers may refer to an element by different names. Herein, it is not intended to distinguish between elements that have different names instead of different functions. In the following description and claims, terminologies such as "include", "comprise", and "have" are used in an open-ended manner, and thus should be interpreted as "including, but not limited to". Therefore, the terminologies "include", "comprise", and/or "have" used in the description of the disclosure denote the presence of corresponding features, regions, steps, operations, and/or elements but are not limited to the presence of one or more corresponding features, regions, steps, operations, and/or elements.

It should be understood that when one element is referred to as being "coupled to", "connected to", or "conducted to" another element, the one element may be directly connected to the another element with electrical connection established, or intervening elements may also be present in between these elements for electrical interconnection (indirect electrical connection). Comparatively, when one element is referred to as being "directly coupled to", "directly conducted to", or "directly connected to" another element, no intervening elements are present in between.

Although terminologies such as first, second, and third may be used to describe different diverse constituent elements, such constituent elements are not limited by the terminologies. The terminologies are used simply to discriminate one constituent element from other constituent elements in the description. In the claims, the terminologies first, second, third, and so on may be used in accordance with the order of claiming elements instead of using the same terminologies. Accordingly, a first constituent element in the following description may be a second constituent element in the claims.

The electronic device provided in the disclosure may include but is not limited to a display device, an antenna device, a sensing device, a light-emitting device, a touch display, a curved display, or a free-shape display. The electronic device may include a bendable or flexible electronic device. The electronic device may include, for instance, liquid crystal, light emitting diode (LED), quantum dot (QD), fluorescence, phosphor, other suitable display media, or a combination thereof, which should however not be construed as a limitation in the disclosure. The LED may include, for instance, an organic light-emitting diode (OLED), a mini LED, a micro LED, a quantum dot LED (including QLED and QDLED), other suitable materials, or a combination thereof, which should however not be construed as a limitation in the disclosure. The display device may, for instance, include a tiled display device, which should however not be construed as a limitation in the disclosure. The antenna device may, for instance, include a liquid crystal antenna, which should however not be construed as a limitation in the disclosure. The antenna device may, for instance, include a tiled antenna device, which should however not be construed as a limitation in the disclosure. Note that the electronic device may be any arrangement or combination of the above, which should however not be construed as a limitation in the disclosure. In addition, the shape of the electronic device may be a rectangle, a circle, a polygon, a shape with a curved edge, or other suitable shapes. The electronic device may have a peripheral system, for instance, a driving system, a control system, or a light source system, to support the display device, the antenna device, or the tiled device, which should however not be construed as a limitation in the disclosure. The sensing device may include a camera, an infrared sensor, or a fingerprint sensor, and the disclosure is not limited thereto. In some embodiments, the sensing device may also include a flash, an infrared (IF) light source, other sensors, electronic elements, or a combination thereof, which should however not be construed as a limitation in the disclosure.

In one or more embodiments of the disclosure, terminologies such as "pixel" or "pixel unit" are used as a unit for describing a specific region including at least one functional circuit for at least one specific function. The region of a "pixel" depends on the unit for providing a specific function. Adjacent pixels may share the same parts or wires, but may also include their own specific parts therein. For instance, adjacent pixels may share the same scan line or the same data line, but the pixels may also have their own transistors or capacitors.

Note that features in different embodiments described below may be replaced, recombined, or mixed with each other to form another embodiment without departing from the spirit of the disclosure.

Please refer to FIG. 1, which is a schematic view of an electronic device according to an embodiment of the disclosure. In this embodiment, an electronic device 100 at least includes a switch circuit 110 and a diode 120. The switch circuit 110 includes a transistor TD. The diode 120 has a first pin PIN1 and a second pin PIN2. The first pin PIN1 is electrically coupled to the transistor TD. The second pin PIN2 is an idle contact.

In this embodiment, the transistor TD has a first terminal TT1, a second terminal TT2, and a third terminal TT3. In this exemplary embodiment, the transistor TD is a PMOS field effect transistor. The first terminal TT1 of the transistor TD is a gate electrode. The second terminal TT2 of the transistor TD is a source electrode. In addition, the third terminal TT3 of the transistor TD is a drain electrode. The second terminal TT2 of the transistor TD is electrically coupled to the first pin PIN1. The first terminal TT1 of the transistor TD is coupled to a common voltage VCOM. In addition, the third terminal TT3 of the transistor TD receives, for instance, a reference low voltage (e.g., grounded). An operating voltage VCC is greater than a voltage at the first terminal TT1 (i.e., the gate electrode) of the transistor TD.

In this embodiment, the diode 120 further has a third pin PIN3 and a fourth pin PIN4. In this exemplary embodiment, the third pin PIN3 is electrically coupled to the operating voltage VCC. The fourth pin PIN4 is an idle contact. In some embodiments, based on different designs, the electrical coupling manner of the first pin PIN1, the second pin PIN2, the third pin PIN3, and the fourth pin PIN4 of the diode 120 may be different from the electrical coupling manner shown in FIG. 1. The electrical coupling manner provided in this disclosure is not limited to what is provided in the present embodiment.

In this embodiment, the switch circuit 110 may be a driver circuit or a compensation circuit adapted to the diode 120, which should however not be construed as a limitation in the disclosure. The transistor TD is, for instance, a driving transistor configured to drive the diode 120 in the electronic device 100, which should however not be construed as a limitation in the disclosure. The diode 120 is a polar element. In this embodiment, the diode 120 is, for instance, a varactor. In some embodiments, the diode 120 may be any type of the light emitting diode. In this embodiment, the electronic device 100 is, for instance, a frequency modulation device. In some embodiments, the electronic device 100 is, for instance, an antenna device.

In this embodiment, the diode 120 further has a first terminal TV1, a second terminal TV2, a first positive electrode P1, and a first negative electrode N1. The diode 120 includes a varactor element VD1. The first positive electrode P1 is an anode of the varactor element VD1. The first negative electrode N1 is a cathode of the varactor element VD1. The first negative electrode N1 of the diode 120 is connected to the first terminal TV1. The first positive electrode P1 of the diode 120 is connected to the second terminal TV2. In other words, the first negative electrode N1 corresponds to the first pin PIN1. In this embodiment, the terminology "correspond to" means that different electrodes or pins are connected to the same side and at the same position. That is, the first negative electrode N1 and the first pin PIN1 are connected to the same side and at the same position. The first positive electrode P1 corresponds to the third pin PIN3. That is, the first positive electrode P1 and the third pin PIN3 are connected to the same side and at the same position. Therefore, the first positive electrode P1 of the diode 120 is coupled to the operating voltage VCC through the third pin PIN3. The first negative electrode N1 of the diode 120 is coupled to the second terminal TT2 of the transistor TD through the first pin PIN1 (i.e., the source electrode). The diode 120 is applicable to the electronic device 100 and is compatible with a p-type transistor TD.

Figure 2:
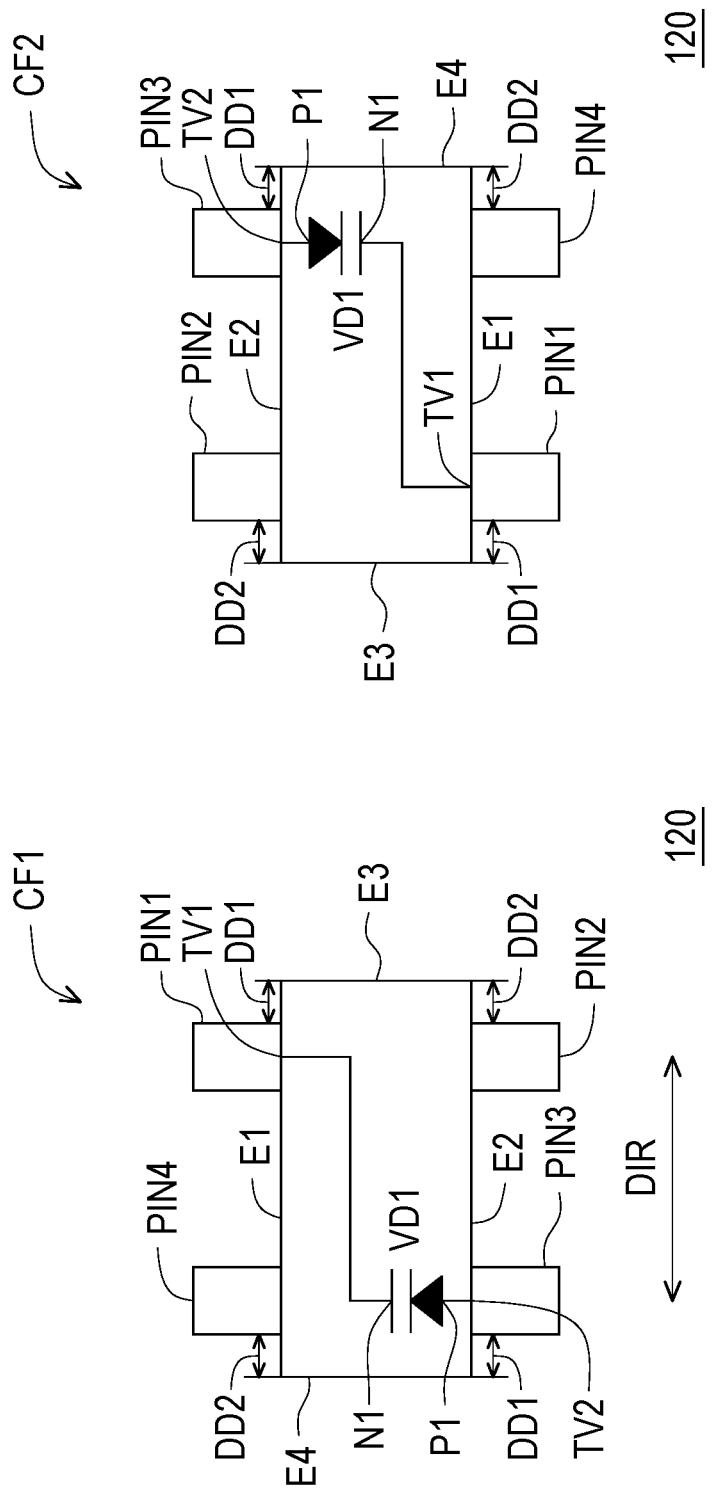
FIG. 2 is a schematic view of a diode according to a first embodiment of the disclosure.

For further explanation, please refer to FIG. 1 and FIG. 2 at the same time. FIG. 2 is a schematic view of a diode according to a first embodiment of the disclosure. In this embodiment, the first pin PIN1, the second pin PIN2, the third pin PIN3, and the fourth pin PIN4 of the diode 120 are disposed in a point symmetrical manner. Further, the first pin PIN1, the second pin PIN2, the third pin PIN3, and the fourth pin PIN4 are disposed in the point symmetrical manner with respect to the center of the diode 120. Therefore, the position of the first pin PIN1 before the diode 120 is rotated by 180° coincides with the position of the third pin PIN3 after the diode 120 is rotated by 180°.

In this embodiment, the diode 120 further has a plurality of sides E1-E4. The first side E1 and the second side E2 are opposite to each other. The first pin PIN1 and the fourth pin PIN4 are disposed on the first side E1. The second pin PIN2 and the third pin PIN3 are disposed on the second side E2. The first pin PIN1 and the third pin PIN3 are disposed opposite to each other. In this embodiment, the fact that the first pin PIN1 and the third pin PIN3 are "disposed opposite to each other" means that the first pin PIN1 and the third pin PIN3 are respectively disposed on opposite sides, and the first pin PIN1 and the third pin PIN3 are the two pins with the longest distance therebetween in an extension direction DIR of the first side E1 and the second side E2. Particularly, the first pin PIN1 and the third pin PIN3 are disposed in a point symmetrical manner, which means that after the first pin PIN1 and the third pin PIN3 are rotated by 180°, the first pin PIN1 and the third pin PIN3 coincide with their respective original positions. Based on different polarity designs, the transistor TD of the electronic device 100 may be an NMOS field effect transistor. The polarity of the diode 120 needs to be reversed. Therefore, it should be noted that the first pin PIN1 and the third pin PIN3 of the diode 120 are disposed in a point symmetrical manner according to the present embodiment, and thus the diode 120 is changed from a configuration CF1 to a configuration CF2. The diode 120 provided in this embodiment may be rotated by 180° to complete the connection. In other words, the original third pin PIN3 is replaced with the first pin PIN1. The original first pin PIN1 is replaced with the third pin PIN3. As such, the rotation of the diode 120 may lead to an immediate reversion of the polarity of the diode 120 without changing the original layout position or layout space of the diode 120.

The third side E3 and the fourth side E4 are opposite to each other. The first pin PIN1 is spaced from the third side E3 by a first distance DD1 in the extension direction DIR of the first side E1. The third pin PIN3 is spaced from the fourth side E4 by the first distance DD1 in the extension direction DIR of the second side E2. Therefore, the first pin PIN1 and the third pin PIN3 are disposed substantially in a diagonal manner across the diode 120. In addition, the first side E1 and the second side E2 are parallel to each other. The third side E3 and the fourth side E4 are parallel to each other. Therefore, the first side E1 and the second side E2 have the same extension direction DIR.

The fourth pin PIN4 is adjacent to the first pin PIN1. The second pin PIN2 is adjacent to the third pin PIN3 and opposite to the fourth pin PIN4. In this embodiment, the fact that the second pin PIN2 and the fourth pin PIN4 are "disposed opposite to each other" means that the second pin PIN2 and the fourth pin PIN4 are respectively disposed on opposite sides, and the second pin PIN2 and the fourth pin PIN4 are the two pins with the longest distance therebetween in the extension direction DIR. Specifically, the second pin PIN2 is adjacent to the third pin PIN3 along the extension direction DIR of the second side E2, which means that the distance between the second pin PIN2 and the third pin PIN3 in the extension direction DIR of the second side E2 is relatively short as compared to other pins. The fourth pin PIN4 is adjacent to the first pin PIN1 along the extension direction DIR of the first side E1, which means that the distance between the fourth pin PIN4 and the first pin PIN1 in the extension direction DIR of the first side E1 is relatively short as compared to other pins. The third pin PIN3 is disposed on the second side E2. the fourth pin PIN4 is disposed on the first side E1. The third pin PIN3 and the fourth pin PIN4 are disposed in a point symmetrical manner, which means that after the third pin PIN3 and the fourth pin PIN4 are rotated by 180°, the third pin PIN3 and the fourth pin PIN4 coincide with their respective original positions.

The second pin PIN2 is spaced from the third side E3 by a second distance DD2 in the extension direction DIR of the second side E2. The fourth pin PIN4 is spaced from the fourth side E4 by the second distance DD2 in the extension direction DIR of the first side E1. Therefore, the second pin PIN2 and the fourth pin PIN4 are disposed substantially in a diagonal manner across the diode 120.

In this embodiment, the second distance DD2 is substantially equal to the first distance DD1. In some embodiments, the second distance DD2 is not equal to the first distance DD1.

At least one of the pins PIN1-PIN4 is an idle contact. In this embodiment, the third pin PIN3 and the fourth pin PIN4 are idle contacts, respectively. That is, in this embodiment, the third pin PIN3 and the fourth pin PIN4 do not receive any signal or voltage.

For explanatory purposes, one single varactor device VD1 and four pins PIN1-PIN4 are taken as an example in this embodiment, which should however not be construed as a limitation in the disclosure. The number of the varactor elements in this disclosure may be one or plural. The number of the pins of the diode 120 in this disclosure may be plural or may be one or plural.

Figure 3:
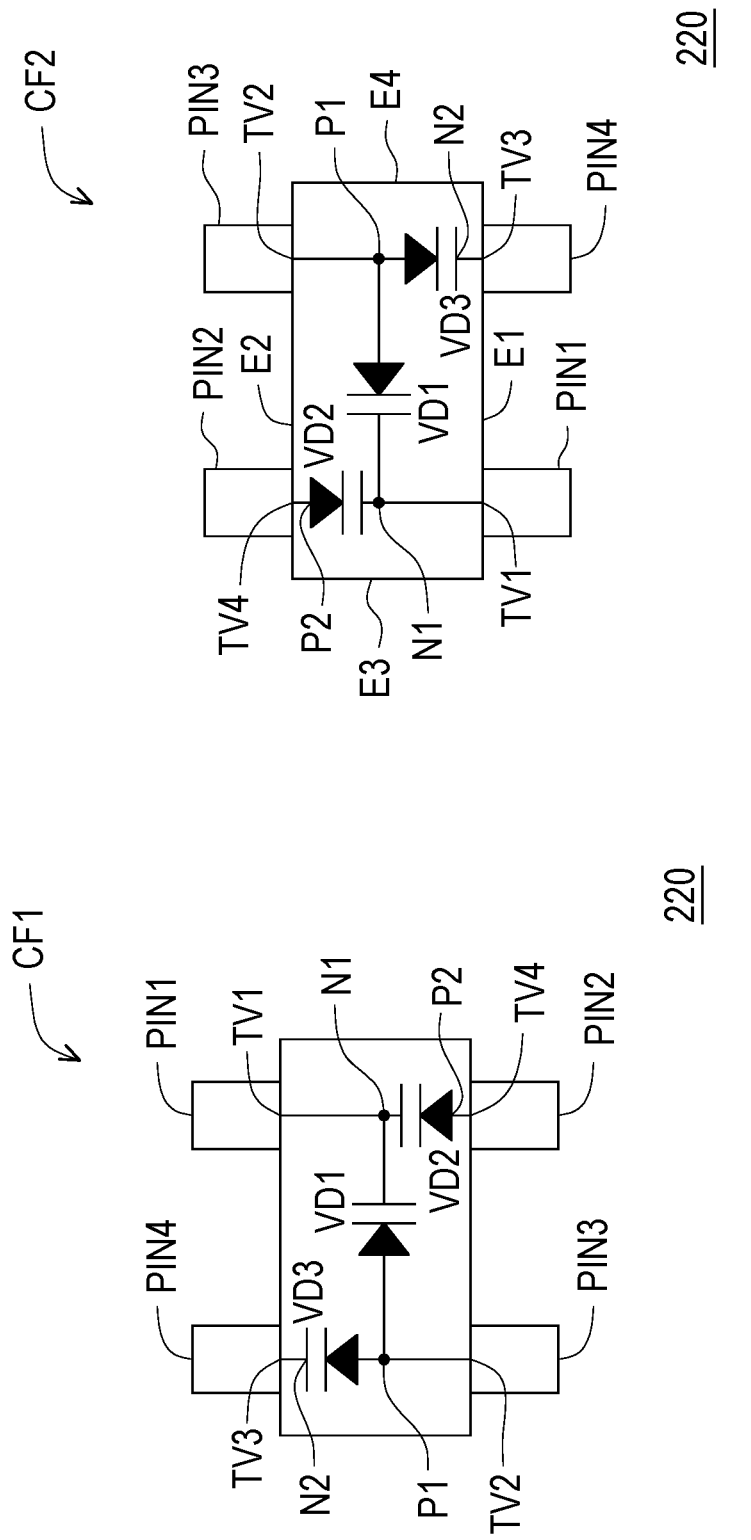
FIG. 3 is a schematic view of a diode according to a second embodiment of the disclosure.

Please refer to FIG. 1 and FIG. 3 at the same time. FIG. 3 is a schematic view of a diode according to a second embodiment of the disclosure. In this embodiment, the diode 220 has a plurality of pins PIN1-PIN4, a plurality of sides E1-E4, a first positive electrode P1, a second positive electrode P2, a first negative electrode N1, and a second negative electrode N2. In this embodiment, the point symmetrical manner in which the pins PIN1-PIN4 are disposed on the sides E1-E4 has been clearly explained in the embodiments depicted in FIG. 1 and FIG. 2 above and thus will not be further explained hereinafter.

In this embodiment, the first negative electrode N1 corresponds to the first pin PIN1. The first positive electrode P1 corresponds to the third pin PIN3. The second negative electrode N2 corresponds to the fourth pin PIN4. The second positive electrode P2 corresponds to the second pin PIN2. The first negative electrode N1 is coupled to the first pin PIN1 through the first terminal TV1. The first positive electrode P1 is coupled to the third pin PIN3 through the second terminal TV2. The second negative electrode N2 is coupled to the fourth pin PIN4 through the third terminal TV3. The second positive electrode P2 is coupled to the second pin PIN2 through the fourth terminal TV4.

The diode 120 includes varactor elements VD1, VD2, and VD3. The first positive electrode P1 is the anode of the varactor elements VD1 and VD3. The first negative electrode N1 is the cathode of the varactor elements VD1 and VD2. The second positive electrode P2 is the anode of the varactor element VD2. The second negative electrode N2 is the cathode of the varactor element VD3.

With reference to FIG. 3, at least one of the varactor elements VD1, VD2, and VD3 is to be operated. For instance, in the configuration CF1, when the first pin PIN1 is coupled to the operating voltage VCC, the second pin PIN2 and the third pin PIN3 are coupled to the second terminal TT2 of the transistor TD, and the varactor elements VD1 and VD3 are operated. In the configuration CF1, the fourth pin PIN2 is the idle contact. In the configuration CF2, the diode 220 provided in this embodiment may be rotated by 180° to complete the connection. Therefore, the first pin PIN1 and the fourth pin PIN4 are coupled to the second terminal TT2 of the transistor TD, and the third pin PIN3 is coupled to the operating voltage VCC. The varactor elements VD1 and VD3 are also operated. However, the polarity of the diode 220 is reversed without changing the original layout position or layout space of the diode 220.

For instance, in the configuration CF1, when the first pin PIN1 is coupled to the operating voltage VCC, the third pin PIN3 is coupled to the second terminal TT2 of the transistor TD, and the varactor element VD1 is operated. In the configuration CF2, the diode 220 provided in this embodiment may be rotated by 180° to complete the connection. Therefore, when the first pin PIN1 is coupled to the second terminal TT2 of the transistor TD and the third pin PIN3 is coupled to the operating voltage VCC, the varactor element VD1 is also operated. In this embodiment, the second pin PIN2 and the fourth pin PIN4 are idle contacts, respectively.

For instance, in the configuration CF1, when the first pin PIN1 and the fourth pin PIN4 are coupled to the operating voltage VCC, the third pin PIN3 is coupled to the second terminal TT2 of the transistor TD, and the varactor elements VD1 and VD2 are operated. In the configuration CF1, the fourth pin PIN4 is the idle contact. In the configuration CF2, the diode 220 provided in this embodiment may be rotated by 180° to complete the connection. Therefore, when the first pin PIN1 is coupled to the second terminal TT2 of the transistor TD and the second pin PIN2 and third pin PIN3 are coupled to the operating voltage VCC, the varactor elements VD1 and VD2 are also operated. In the configuration CF2, the second pin PIN2 is the idle contact.

Figure 4:
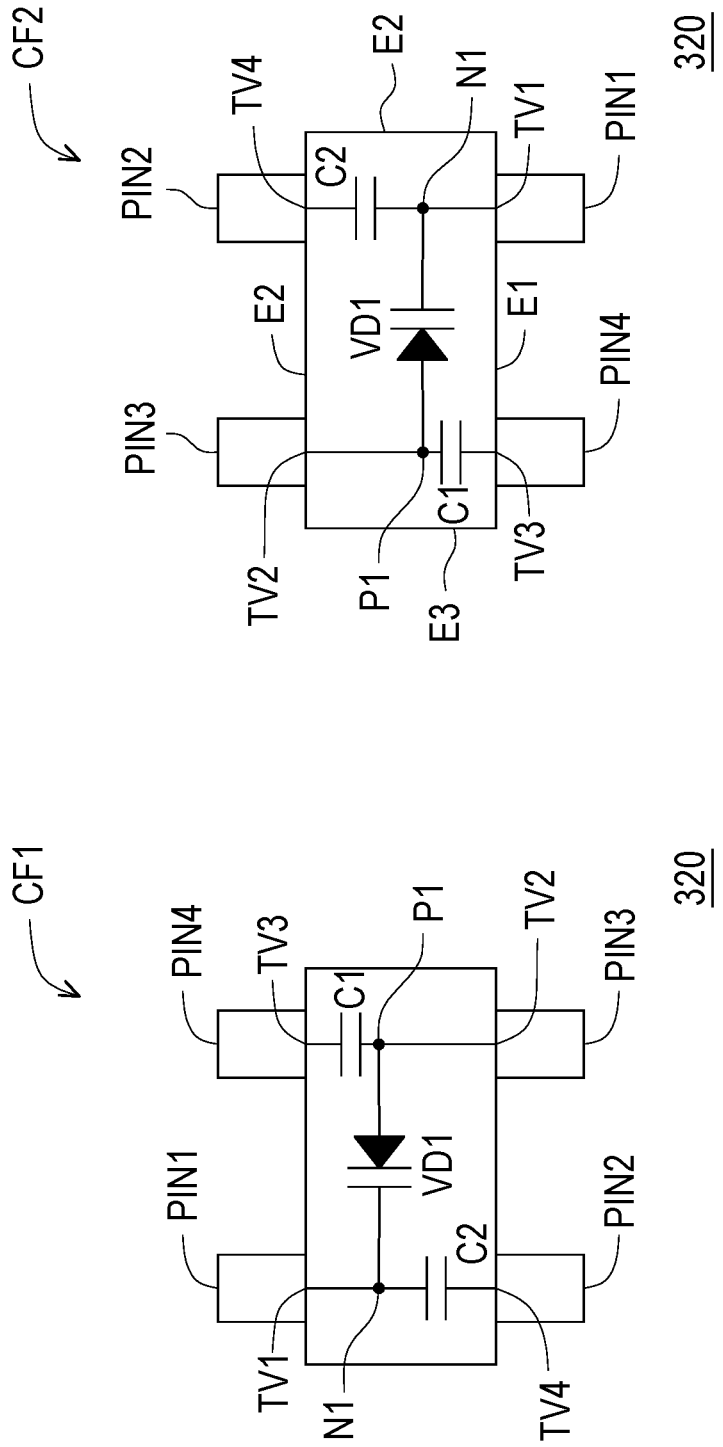
FIG. 4 is a schematic view of a diode according to a third embodiment of the disclosure.

Please refer to FIG. 1 and FIG. 4 at the same time. FIG. 4 is a schematic view of a diode according to a third embodiment of the disclosure. In this embodiment, a diode 320 has a plurality of pins PIN1-PIN4, a plurality of sides E1-E4, a first positive electrode P1, and a first negative electrode N1. In this embodiment, the point symmetrical manner in which the pins PIN1-PIN4 are disposed on the sides E1-E4 has been clearly explained in the embodiments depicted in FIG. 1 and FIG. 2 above and thus will not be further explained hereinafter.

In this embodiment, the first negative electrode N1 corresponds to the first pin PIN1. The first positive electrode P1 corresponds to the third pin PIN3. The first negative electrode N1 is coupled to the first pin PIN1 through the first terminal TV1. The first positive electrode P1 is coupled to the third pin PIN3 through the second terminal TV2. The diode 120 includes the varactor element VD1, a first capacitor C1, and a second capacitor C2. The first positive electrode P1 is the anode of the varactor element VD1. The first negative electrode N1 is the cathode of the varactor element VD1.

The first capacitor C1 corresponds to the fourth pin PIN4. The second capacitor C2 corresponds to the second pin PIN2. Specifically, the first capacitor C1 is coupled between the third pin PIN3 and the fourth pin PIN4. The second capacitor C2 is coupled between the first pin PIN1 and the second pin PIN2.

For instance, in the configuration CF1, when the first pin PIN1 is coupled to the operating voltage VCC, the third pin PIN3 is coupled to the second terminal TT2 of the transistor TD, and the varactor element VD1 is operated. In the configuration CF2, the diode 220 provided in this embodiment may be rotated by 180° to complete the connection. Therefore, when the first pin PIN1 is coupled to the second terminal TT2 of the transistor TD and the third pin PIN3 is coupled to the operating voltage VCC, the varactor element VD1 is also operated. In this embodiment, the second pin PIN2 and the fourth pin PIN4 are idle contacts, respectively.

For instance, in the configuration CF1, when the first pin PIN1 and the fourth pin PIN4 are coupled to the operating voltage VCC, the third pin PIN3 is coupled to the second terminal TT2 of the transistor TD, and the varactor element VD1 and the second capacitor C2 are operated. In the configuration CF1, the fourth pin PIN4 is the idle contact. In the configuration CF2, the diode 320 provided in this embodiment may be rotated by 180° to complete the connection. Therefore, when the first pin PIN1 is coupled to the second terminal TT2 of the transistor TD and the second pin PIN2 and the third pin PIN3 are coupled to the operating voltage VCC, the varactor elements VD1 and VD2 are also operated. In the configuration CF2, the second pin PIN2 is an idle contact.

Figure 5:
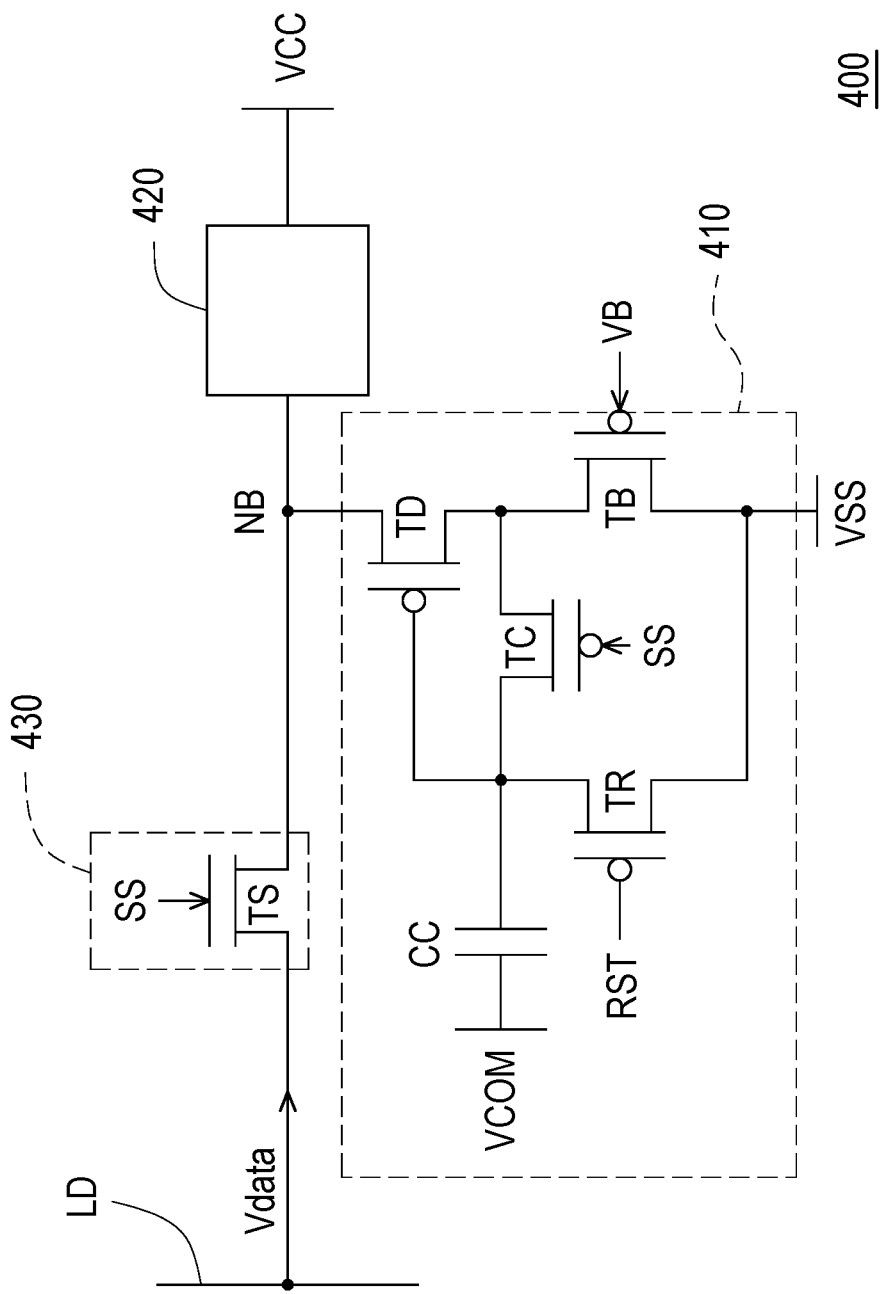
FIG. 5 is a circuit diagram of an electronic device according to an embodiment of the disclosure.

Please refer to FIG. 5. FIG. 5 is a circuit diagram of an electronic device according to an embodiment of the disclosure. In this embodiment, an electronic device 400 includes a switch circuit 410, a diode 420, and a selection circuit 430. The switch circuit 410 includes transistors TB, TC, TD, and TR and a capacitor CC. The capacitor CC is coupled between a first terminal of the transistor TD and a common voltage VCOM. A second terminal of the transistor TD is coupled to a node NB. A first terminal of the transistor TR receives a reset signal RST. A second terminal of the transistor TR is coupled to the first terminal of the transistor TD. A third terminal of the transistor TR is coupled to a reference low voltage VSS. A first terminal of the transistor TC receives a selection signal SS. A second terminal of the transistor TC is coupled to the first terminal of the transistor TD. A third terminal of the transistor TC is coupled to a third terminal of the transistor TD. A first terminal of the transistor TB receives a bias voltage VB. A second terminal of the transistor TB is coupled to the third terminal of the transistor TD. A third terminal of the transistor TB is coupled to the reference low voltage VSS. In this embodiment, the switch circuit 410 is configured, for instance, to compensate a voltage value at the node NB.

The selection circuit 430 is coupled between a data line LD and the node NB. The selection circuit 430 provides a data voltage Vdata on the data line LD to the node NB in response to the selection signal SS. The selection circuit 430 includes a transistor TS. A first terminal of the transistor TS receives the selection signal SS. A second terminal of the transistor TS is coupled to the data line LD. A third terminal of the transistor TS is coupled to the node NB.

In this embodiment, the diode 420 is coupled between the operating voltage VCC and the node NB. The diode 420 may be, for instance, implemented in form of one of the diodes 120, 220, and 320 depicted in in FIG. 2 to FIG. 4.

In this embodiment, the transistors TB, TC, TD, and TR are, for instance, implemented in form of the PMOS transistors. The transistor TS is, for instance, implemented in form of the NMOS transistor. Based on the description of the embodiments in FIG. 1 to FIG. 4, it should be understood that if the transistors TB, TC, TD, and TR are respectively, for instance, implemented in form of the NMOS transistors instead, the diode 420 may be rotated by 180° to complete the connection. The rotation of the diode 420 may immediately reverse the polarity of the diode 420 without changing the original layout position or layout space of the diode 420, and after the diode 420 is rotated by 180°, the operating voltage VCC connected to the second pin PIN2 of the diode 720 should be greater than the voltage at the first terminal TT1 of the transistor TD connected to the first pin PIN1. Similarly, the effect of polarity reversal in the PMOS transistors may also be achieved in the NMOS transistors.

To sum up, the diode provided in one or more embodiments of the disclosure is designed in a point symmetrical manner. As such, based on different polarity designs, the rotation of the diode may immediately reverse the polarity of the diode without changing the original layout position or layout space of the diode.

Although the embodiments of the disclosure and the advantages thereof have been disclosed above, it should be understood that any person skilled in the art can make changes, substitutions, and modifications without departing from the spirit and scope of the disclosure, and the features of the embodiments can be arbitrarily mixed and replaced to form other new embodiments. In addition, the protection scope of the disclosure is not limited to the process, machine, manufacture, material composition, device, method, and steps in the specific embodiments described in the specification. Any person skilled in the art can understand conventional or future-developed processes, machines, manufactures, material compositions, devices, methods, and steps from the content of the disclosure as long as the same can implement substantially the same functions or achieve substantially the same results in the embodiments described herein. Therefore, the protection scope of the disclosure includes the above processes, machines, manufactures, material compositions, devices, methods, and steps. In addition, each claim constitutes a separate embodiment, and the protection scope of the disclosure further includes combinations of the claims and the embodiments. The protection scope of the disclosure should be defined by the appended claims.

What is claimed is:

1. An electronic device, comprising:
   a switch circuit, comprising:
   a transistor; and
   a diode, having a first pin, a second pin, a third pin and a fourth pin, wherein the first pin is electrically coupled to the transistor, and the second pin is an idle contact, wherein the first pin, the second pin, the third pin, and the fourth pin are disposed in a point-symmetrical manner, wherein:
   the first pin and the third pin are disposed substantially in a diagonal manner across the diode, and
   the second pin and the fourth pin are disposed substantially in a diagonal manner across the diode.

2. The electronic device according to claim 1, wherein:
   the transistor has a first terminal and a second terminal, the first terminal is a gate electrode, the second terminal is a source electrode, and the second terminal is electrically coupled to the first pin.

3. The electronic device according to claim 1, wherein the diode further has a first positive electrode and a first negative electrode,
   the first negative electrode corresponds to the first pin, and
   the first positive electrode corresponds to the third pin.

4. The electronic device according to claim 1, wherein the third pin is further coupled to an operating voltage.

5. The electronic device according to claim 4, wherein the operating voltage is greater than a voltage at the first terminal of the transistor.

6. The electronic device according to claim 1, wherein:
   the diode further has a first side and a second side,
   the first side and the second side are opposite to each other,
   the first pin and the fourth pin are disposed on the first side, and
   the second pin and the third pin are disposed on the second side.

7. The electronic device according to claim 6, wherein:
   the diode further has a third side and a fourth side,
   the third side and the fourth side are opposite to each other,
   the first pin is spaced from the third side by a first distance along an extension direction of the first side, and
   the third pin is spaced from the fourth side by the first distance along an extension direction of the second side.

8. The electronic device according to claim 7, wherein:
   the second pin is spaced from the third side by a second distance along the extension direction of the second side, and
   the fourth pin is spaced from the fourth side by the second distance along the extension direction of the first side.

9. The electronic device according to claim 1, wherein:
   the diode further has a first capacitor and a second capacitor,
   the first capacitor corresponds to the fourth pin, and
   the second capacitor corresponds to the second pin.

10. The electronic device according to claim 1, wherein the transistor is a PMOS field effect transistor.

11. A diode, comprising:
    a first pin;
    a second pin;
    a third pin; and
    a fourth pin,
    wherein the first pin, the second pin, the third pin, and the fourth pin are disposed in a point symmetrical manner, wherein:
    the first pin and the third pin are disposed substantially in a diagonal manner across the diode, and
    the second pin and the fourth pin are disposed substantially in a diagonal manner across the diode.

12. The diode according to claim 11, further comprising a first capacitor and a second capacitor, wherein the first capacitor corresponds to the fourth pin, and the second capacitor corresponds to the second pin.

13. The diode according to claim 11, wherein:
    the diode further comprises a first side and a second side,
    the first side and the second side are opposite to each other,
    the first pin and the fourth pin are disposed on the first side, and
    the second pin and the third pin are disposed on the second side.

14. The diode according to claim 13, wherein:
    the diode further comprises a third side and a fourth side,
    the third side and the fourth side are opposite to each other,
    the first pin is spaced from the third side by a first distance along an extension direction of the first side, and
    the third pin is spaced from the fourth side by the first distance along an extension direction of the second side.

15. The diode according to claim 14, wherein:
    the second pin is spaced from the third side by a second distance along the extension direction of the second side, and
    the fourth pin is spaced from the fourth side by the second distance along the extension direction of the first side.

16. The diode according to claim 11, wherein the diode further comprises a first positive electrode and a first negative electrode,
    the first negative electrode corresponds to the first pin, and
    the first positive electrode corresponds to the third pin.

17. The diode according to claim 16, wherein one of the first pin and the third pin is coupled to an operating voltage.

\* \* \* \* \*